United States Patent [19]
Connell et al.

[11] Patent Number: 6,018,750
[45] Date of Patent: Jan. 25, 2000

[54] FAST AND EFFICIENT MEDIAN SEARCH METHOD AND FILTER

[75] Inventors: Lawrence E. Connell, Naperville; Steven W. Bergstedt, Schaumburg, both of Ill.

[73] Assignee: Motorola Inc., Schaumburg, Ill.

[21] Appl. No.: 08/511,667

[22] Filed: Aug. 7, 1995

[51] Int. Cl.$^7$ .............................. G06F 7/00; G06F 17/10
[52] U.S. Cl. ........................................... 708/202; 708/304
[58] Field of Search ................................. 708/202, 300, 708/304, 316, 320, 322, 421

[56] References Cited

U.S. PATENT DOCUMENTS

| | | | |
|---|---|---|---|
| 4,928,258 | 5/1990 | May | 364/724.17 |
| 4,951,242 | 8/1990 | Hobson | 364/715.01 |
| 5,138,567 | 8/1992 | Mehrgardt | 624/724.014 |
| 5,144,568 | 9/1992 | Glover | 364/715.013 |
| 5,708,595 | 1/1998 | Connell | 364/715.01 |

OTHER PUBLICATIONS

"Median Filtering by Threshold Decomposition" by J. Patrick Fitch, Edward Coyle and Neal Gallagher, Jr. IEEE Transactions on Acoustics, Speech and Signal Processing vol. ASSP–32, #6, Dec. 1984.
"Windowless Techniques for LPC Analysis" by Thomas P. Barnwell, IEEE Transactions on Acoustics, Speech and Signal Processing, vol. ASSP–28, No. 4, Aug. 1980.
"A Fast Method for Real–Time Median Filtering" by E. Ataman, V.K. Aatre and K.M. Wong, IEEE Transactions on Acoustics, Speech and Signal Processing, vol. ASSP28, #4, Aug. 1980.
"VSLI Implementation of a Fast Rank Order Filtering Algorithm" by R. G. Harber, S.C. Bass, G.W. Neudeck, School of Electrical Engineering, Purdue University, May. 1985.
"Design and Implementation of a Single–Chip 1–D Medial Filter" by Kemal Oflazer, Department of Computer Science, Carnegie–Mellon University, Apr. 1982.
"Design and Implementation of a Single–Chip 1–D Median Filter" by Kemal Oflazer, Student Member, IEEE, IEEE Transactions on Acoustics, Speech and Signal Processing, vol. ASSP–31, N0. 5, Oct. 1983.
"Fast Algorithms for Analysing and Designing Weighted Medial Filters" by Ruikang Yang, Moncef Gabbouj and Yrjo Neuvo, Audio–Visual Signal Processing La, Nokia Research Center, Finland May. 2, 1994.
"An Overview of Median and Stack Filtering" by Moncef Gabbouj, Edward Coyle and Neal C. Gallagher, Jr. Circuits Systems and Signal Processing, vol 11, #1, 1991.
"Design and Implementation of a General–Purpose Medial Filter Unit in CMOS VLSI" by Mustafa Karaman, Levent Onural and Abdullah Atalar, IEEE Journal of Solid–State Circuits, vol. 25, #2, Apr. 1980.
"On the Design of a Real–Time Median Filter" by Dodrill and K. Kanopoulos, The Euromicro Journal, vol. 27, Sep. 1980.
"A New Algorithm for Real–Time Median Filtering" by V. Bapeswara Rao and K. Sankara Rao, IEEE Transactions on Acoustics, Speech and Signal Processing, vol. ASSP–34, #6, Dec. 1986.

*Primary Examiner*—Emmanuel L. Moise
*Attorney, Agent, or Firm*—Nicholas C. Hopmar

[57] ABSTRACT

A fast and efficient median search method and filter searches a dynamically changing time-ordered list of data samples for a data sample representing the arithmetic median of the list. Embodiments include a method to reduce the number of memory access operations to 2N and a method to reduce the number of memory access operations to N, where N is the number of data samples searched. The described approach includes providing a circular list of N data samples including an incoming data sample replacing an outgoing data sample, and a median data sample. Then, updating the median data sample dependent on magnitudes of the incoming data sample, the median data sample, and the outgoing data sample.

12 Claims, 6 Drawing Sheets

| OUTGOING DATA SAMPLE | INCOMING DATA SAMPLE | SEARCH SPACE 305 |
|---|---|---|
| GREATER THAN | GREATER THAN | NO CHANGE NEEDED, THE MAGNITUDE OF THE NEXT MEDIAN DATA SAMPLE IS THE SAME AS THE MAGNITUDE OF THE CURRENT MEDIAN DATA SAMPLE |
| LESS THAN | LESS THAN | |
| EQUAL TO | EQUAL TO | |
| GREATER THAN | EQUAL TO | |
| LESS THAN | EQUAL TO | |
| GREATER THAN | LESS THAN | THE MAGNITUDE OF THE NEXT MEDIAN DATA SAMPLE IS EITHER EQUAL TO THE MAGNITUDE OF THE CURRENT MEDIAN DATA SAMPLE OR THE MAGNITUDE OF A DATA SAMPLE HAVING A MAGNITUDE MOST ADJACENT AND LESS THAN THE MAGNITUDE OF THE CURRENT MEDIAN DATA SAMPLE |
| EQUAL TO | LESS THAN | |
| LESS THAN | GREATER THAN | THE MAGNITUDE OF THE NEXT MEDIAN DATA SAMPLE IS EITHER EQUAL TO THE MAGNITUDE OF THE CURRENT MEDIAN DATA SAMPLE OR THE MAGNITUDE OF A DATA SAMPLE HAVING A MAGNITUDE MOST ADJACENT AND GREATER THAN THE MAGNITUDE OF THE CURRENT MEDIAN DATA SAMPLE |
| EQUAL TO | GREATER THAN | |

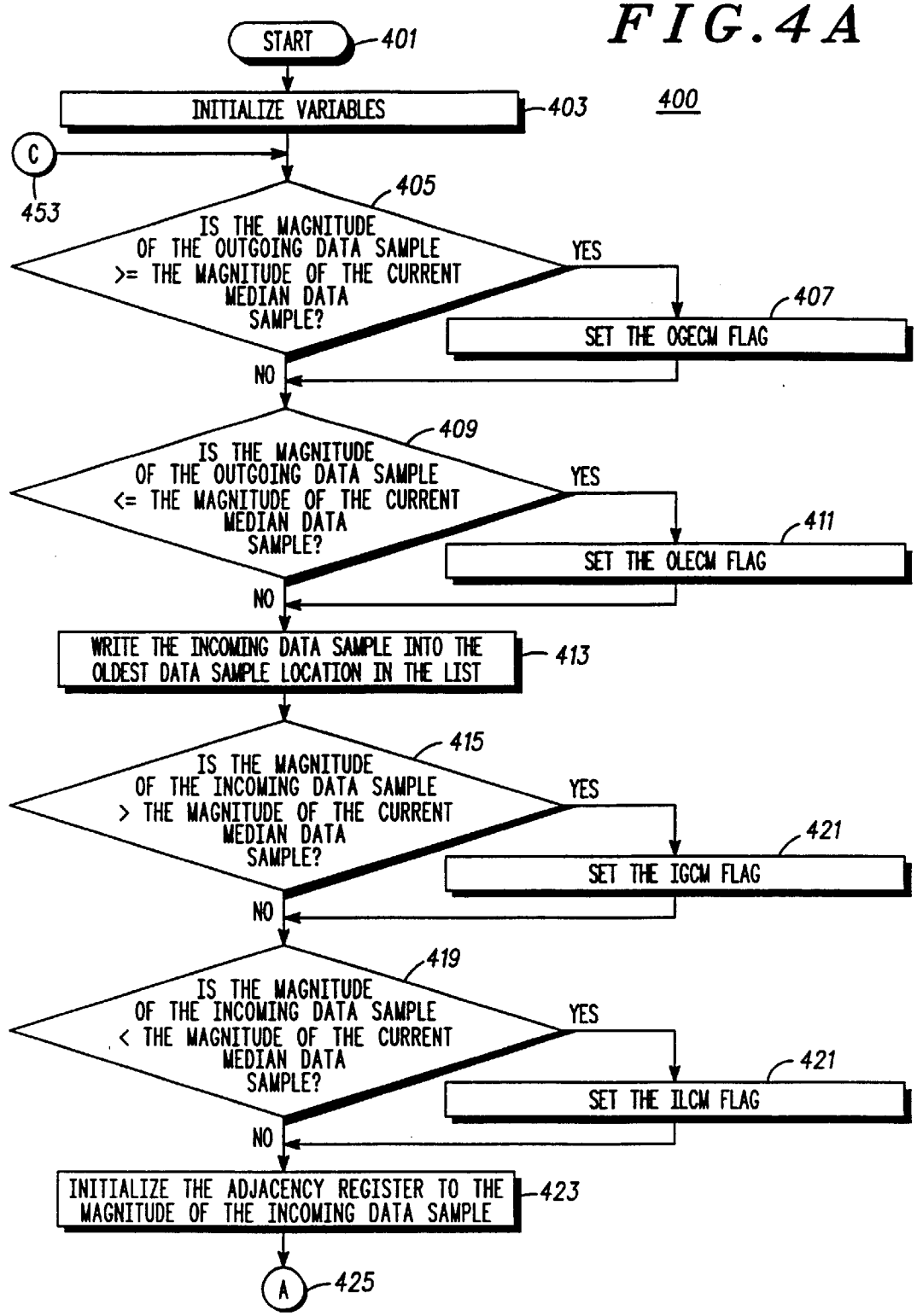

FAST AND EFFICIENT MEDIAN SEARCH METHOD AND FILTER

FIELD OF THE INVENTION

This invention is generally directed to the field of filters and is useful in the area of digital filtering of signals.

BACKGROUND OF THE INVENTION

Contemporary signal processing systems often use filters to remove undesirable information from signals to improve signal fidelity. In digital signal processing schemes it is often desirable to apply a median filter to process signals. Median filters are non-linear filters that can be used to achieve dramatic results in diverse subtractive synthesis applications such as in video, speech, general acoustics, radar, and other uses of signal processing.

In particular a median filter may be applied to significantly improve signal-to-noise ratio in internal combustion engine performance monitoring and control applications. One such application is misfire determination. In this application an engine's combustion performance is monitored by observing, for example, acceleration of the engine's crankshaft via an accelerometer. In an ideal situation, if a cylinder of the engine under observation misfires (all of the air-fuel mixture charged into the cylinder doesn't completely combust) the engine's crankshaft will tend to decelerate rather than accelerate as expected. If this deceleration is observed by a misfire detection system, then a misfire can be indicated.

In a typical application however there are many sources of noise that contaminate the observation process. For one, since the engine is mechanically coupled to a transmission, which in turn is coupled to a drive shaft and wheel assembly, as a vehicle powered by the engine traverses, a bump in the road surface can cause a decelerating disturbance to the wheel assembly. Through the above-described coupling mechanism the disturbance can be reversed coupled back to the engine's crankshaft—thus the accelerometer. Some form of signal fidelity improvement is necessary to eliminate this source of noise to prevent a false misfire indication. Since this source of noise causes a signal to be generated at a characteristically very low frequency the signal processing mechanism could use a traditional digital high-pass filter to filter out these disturbances. Practically this would require a very high order digital filter because the signal spectra generated by misfiring behavior by the accelerometer is closely proximate the signal spectra associated with the road surface induced signal.

A median filter fits well into this type of application for eliminating the road surface induced signal from the misfire related spectra generated by the accelerometer. The median filter achieves a similar result to a very high order digital high-pass filter with a relatively low order structure.

Digital or sampled data type median filters function by operating on a fixed-length list of data samples. The median filter determines which sample present on the fixed-length list represents a value arithmetically median within the list. Some prior art median filters used a storage memory intensive scheme for resolving the median value within a list of data samples. For instance, once a list is filled with data it is sorted into an arithmetically ordered list and the data sample positioned in the center of the list becomes the median result. By subtracting the median result from the time ordered data sample positioned at the center of the time ordered list a median filtered data sample can be synthesized. This can be shown more clearly with an example.

TABLE 1

| time ordered data samples | magnitude ordered data samples |
|---|---|
| 135 | 130 |
| 130 | 131 |
| 137 | 135 |
| 138 | 137 |
| 131 | 138 |
| 140 | 140 |
| 143 | 143 |
| 148 | 143 |
| 143 | 148 |

In TABLE 1 above a left-most column represents a list of time ordered data samples. In other words the data sample in the top-most row "135" is the newest data sample and the data sample in the bottom-most row "143" is the oldest data sample. These samples are representative of acceleration of an engine's crankshaft derived from an accelerometer. A right-most column represents a list of magnitude ordered data samples. These samples are ordered by prior art schemes to find the median value. Since the list length (or filter order) is odd, the center position of the magnitude ordered list will contain the median data sample—here "138". So, the median filtered value can be derived as 131−138 or −7. Although this general approach is functional it has several problems. For one it requires at least enough storage memory to hold the magnitude ordered data sample list in addition to the time ordered data sample list. This is particularly problematic for reduction to practice on an integrated circuit because of the large area of silicon real estate necessary to support the additional storage memory requirements. Also, this scheme requires sorting each of the data samples on the list before the median data sample can be reliably found and is therefore time intensive and requires complicated control circuitry.

Typically, for a list comprising N data samples, $N^2/2$ memory access operations are used to perform a sort. These memory access operations require a substantial amount of execution time. Previous attempts to reduce the number of memory accesses or execution time have, unfortunately, been at the expense of a hardware complexity which grows at an exponential rate with N.

What is needed is an improved median search method and filter that is iteration limited so that it can be effectively manufactured on an integrated circuit or efficiently executed as a method.

BRIEF DESCRIPTION OF THE DRAWINGS

FIG. 3 illustrates details of step 205 introduced in FIG. 2 in a tabular format;

FIG. 4A, 4B, and 4C are flow charts further detailing the preferred method steps introduced in FIG. 2.

DETAILED DESCRIPTION OF A PREFERRED EMBODIMENT

A time efficient median search method and filter searches a dynamically changing time-ordered list of data samples for a data sample representing the arithmetic median of the list. A next median is determined by one of several embodiments.

An essential tenet to the described approach is that an incoming data sample will cause the current median data sample to either remain the same or change to a magnitude of a data sample of the list most arithmetically adjacent (numerically proximate) either increasing or decreasing in magnitude. Whether or not the next median data sample will increase or decrease in magnitude depends on the other data samples in the list. Given this assumption there are several different embodiments that will result in a significant reduction of memory accesses used to find a value median within a list. As mentioned in the background section prior art systems require $N^2/2$ memory accesses to resolve a median value in a set or list of values—where N is the rank or quantity of entries in the list. The number of memory access operations becomes very important in many systems because the filter rank, N, can be quite large—making prior art schemes that use $N^2/2$ memory accesses to resolve a median highly inefficient. The preferred embodiments will be described after an introduction of FIG. 1 which uses an engine misfire detection system to illustrate the method and filter. Note that as mentioned in the background section that median search techniques and median filters can be gainfully applied to other applications such as video, speech, general acoustics, radar. The improvements described here will benefit these and other applications as well.

Figure 1:
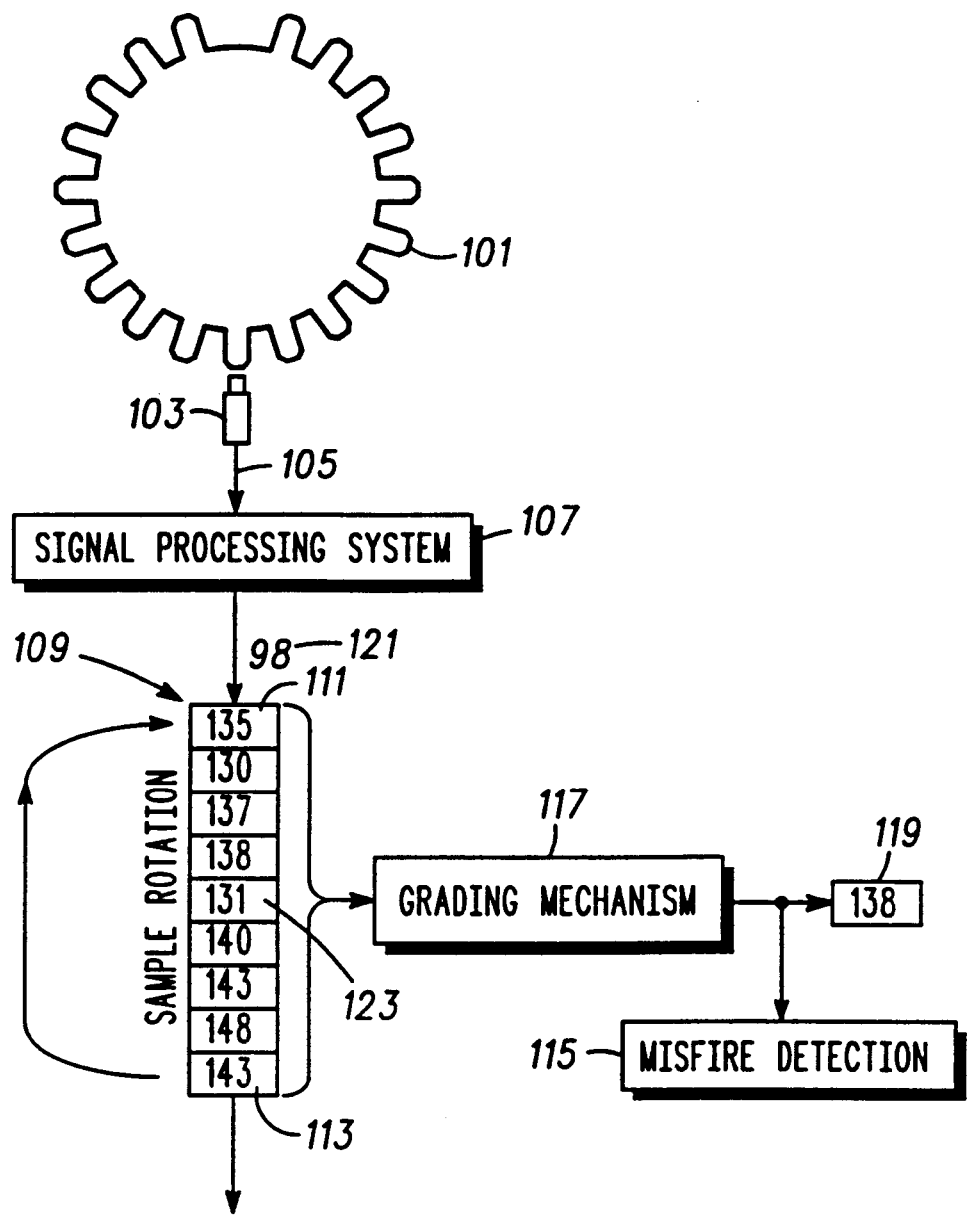
FIG. 1 is a system block diagram in accordance with a preferred embodiment of the invention.

FIG. 1 is a system diagram illustrating an overall approach for applying a median filter in a misfire detection system. An engine crankshaft drives an encoder wheel 101 having marks disposed radially thereon. An accelerometer 103 senses the rotation of the encoder wheel 101, and outputs a signal 105 indicative of an acceleration of the encoder wheel 101. This signal 105 is coupled into a signal processing system 107. This signal processing system 107 digitizes the signal 105 and provides a discrete time sampled representation of the acceleration behavior of the encoder wheel 101. These discrete time data samples are provided to a storage memory device 109 preferably constructed as a list in taking the form of a circular queue having a length N. As the encoder wheel 101 rotates, each new data sample entry is stored into the storage memory device 109 by writing over the oldest data sample entry. For instance, in FIG. 1 reference number 111 shows the newest data sample which has a value of 135, and an oldest data sample 113 which has value of 143. As a next data sample becomes available— here shown with a value of 98 at reference number 121, the oldest data sample 113 will be written over and replaced by the newest data sample (98). At a much higher rate than the data samples are changing, a grading mechanism 117 is used to find the median data sample within the list represented in the circular queue 109. This continuously graded median value 119, here the data sample having a value 138, is then used to produce a median filtered data sample. This filtering is accomplished by subtracting the continuously graded median value 119 from a time centered data sample from the queue. The result is presented to a misfire detection apparatus 115 which uses this continuously filtered median data sample to determine misfire behavior of the engine. Preferably, the misfire detection apparatus 115 includes a comparison circuit for providing a misfire indication when the median filtered data sample of the data samples in the queue exceeds a misfire threshold. The misfire threshold is preferably programmable and stored in the misfire detection apparatus 115.

Now that the system block diagram has been described details of the improved method and filter will be described.

In an embodiment that reduces the number of memory accesses required to resolve a median value from $N^2/2$ to 2N, the next median is found by determining for each new incoming data sample whether the next median sample will remain the same as the current median data sample or change to the magnitude of the data sample which is most numerically adjacent; either increasing or decreasing in magnitude. This method is based on the fact that for each new incoming data sample, the next median can only be one of three choices; it can remain the same as the current median, increase in magnitude to the next largest data sample value relative to the magnitude of the current median, or decrease in magnitude to the next smallest data sample value relative to the magnitude of the current median.

First, a test is performed on the current median to determine if it will become the next median. The test consists of making a first pass through the list and comparing the current median to all the samples in the list. In this approach the list 109 is traversed a first time while keeping a count of a quantity of data samples having a magnitude numerically less than the current median data sample. Concurrently, another counter keeps track of a quantity of data samples having a magnitude numerically less than or equal to the current median data sample. Concurrently, a data sample having a magnitude most numerically adjacent and larger relative to the magnitude of the current median data sample is found. At the end of this first iteration or pass on the N elements in the list the counters are checked to determine if the median data sample for the (new) list will have the same magnitude as the current median data sample or change. If the number of data samples from the list having a magnitude less than the current median data sample is less than or equal to (N−1)/2 and the number of data samples from the list having a magnitude less than or equal to the current median data sample is greater than (N−1)/2, then the next median will equal the current median.

If the magnitude of the current median data sample needs to change based on the former step, then the list is traversed a second time and a count is made of a quantity of data samples having a magnitude numerically less than the data sample identified in the previous step (the one most numerically adjacent and larger). Concurrently, another counter keeps track of a quantity of data samples having a magnitude numerically less than or equal to the data sample identified in the previous step (the one most numerically adjacent and larger). Concurrently, a data sample having a magnitude most numerically adjacent and smaller than the magnitude of the current median data sample is found. At the end of this second pass through the list the counters are checked to determine if the median data sample for the list is equal to the next larger data sample. If the number of data samples from the list having a magnitude less than the next largest data sample is less than or equal to (N−1)/2 and the number of data samples from the list having a magnitude less than or equal to the next largest data sample is greater than (N−1)/2, then the next median will equal the data sample having the next largest magnitude relative to the current median.

Next, if the median data sample for the list is not equal to the next larger data sample then it is set to the next smaller data sample. This approach is both simple and efficient. Also in an apparatus embodiment it is silicon efficient.

In an embodiment that reduces the number of memory access operations to resolve a median value from $N^2/2$ to N, the next median is found by testing an incoming data sample and an outgoing data sample against a current median data sample to quickly reduce the number of possible choices for the next median from three to two. By including the outgoing data sample in this evaluation the 2N memory access method can be reduced to N memory accesses. A next step is to search the list and identify a data sample that has a magnitude most adjacent to and greater than the current median data sample if the median data sample for the list should increase as determined previously and identify a data sample having a magnitude most adjacent to and less than the current median data sample if the median data sample for the list should decrease as determined previously and provide a most adjacent data sample if the median data sample for the list should change. Concurrently, as the list is traversed, test if the median data sample will change by determining if a number of data samples from the circular list having a magnitude less than the current median is greater than (N−1)/2 or if the number of data samples from the circular list having a magnitude less than or equal to the current median data sample is less than or equal to (N−1)/2. If either one of these two conditions is satisfied, then the magnitude of the current median data sample is changed to the most adjacent data sample found earlier.

A more thorough understanding of the inventive aspects of the above-introduced structure will become apparent with the introduction and detailed description of the remaining figures.

Figure 2:
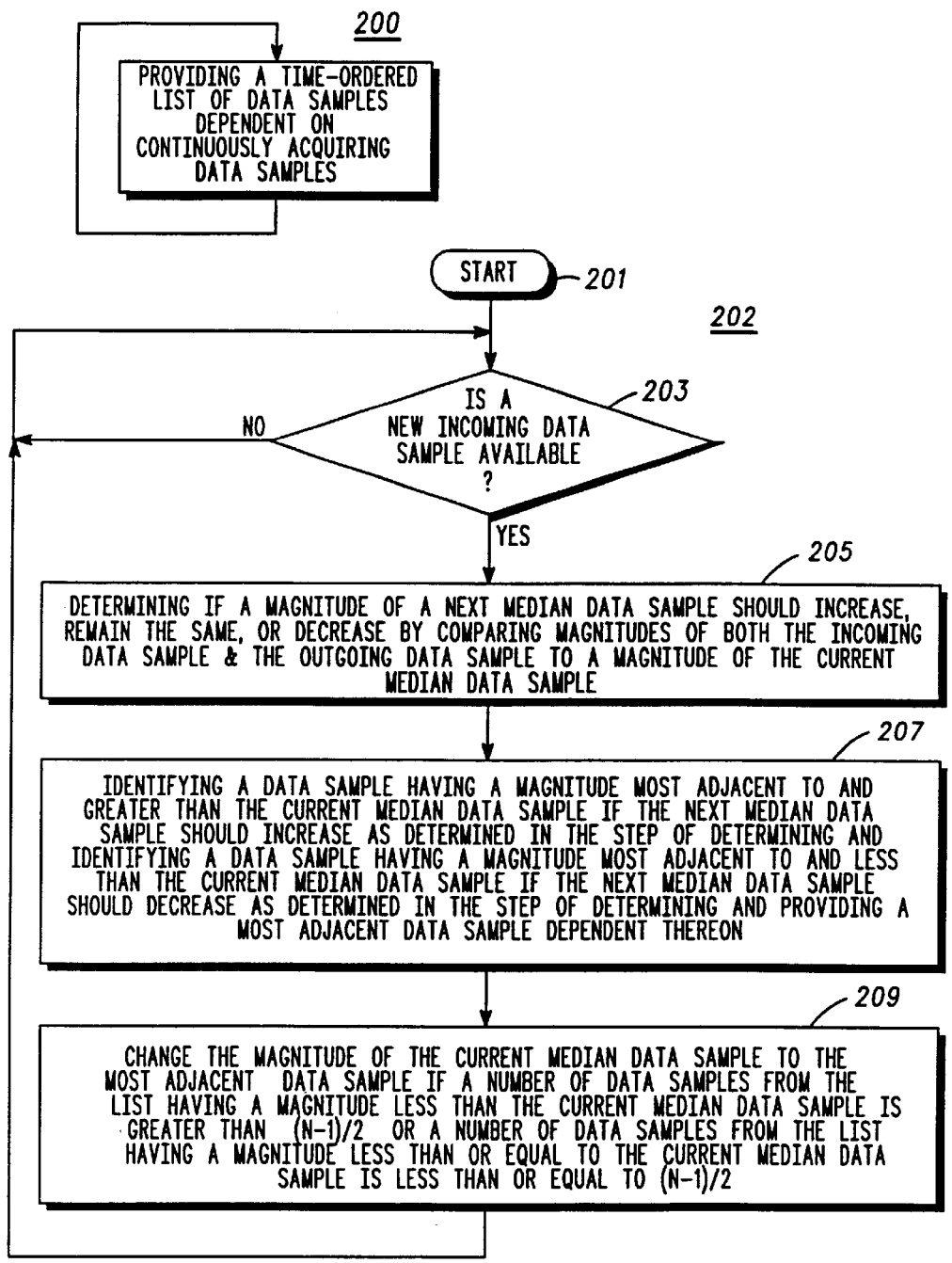
FIG. 2 is a simplified flow chart illustrating the preferred method.

FIG. 2 is a simplified flow chart illustrating the preferred method. The routine 200 preferably is embedded into a Motorola MC68HC332 microcontroller indigenous to the signal processing system 107 introduced in FIG. 1. Alternatively, the method steps could be implemented in a hardware state machine which could be easily integrated onto a signal processing integrated circuit.

FIG. 2 represents the embodiment illustrating the N memory access method. First, a test is executed comparing an incoming data sample and an outgoing data sample to the current median (found on the previous iteration of the method steps) to determine whether or not the next median should increase, decrease, or remain the same magnitude as the current median. In FIG. 1 the incoming sample has a magnitude of 98 and is shown at reference number 121. The outgoing (or oldest in terms of time) data sample has a magnitude of 143 as shown at reference number 113, and the current median has a magnitude of 138 as shown at reference number 119.

Note that there is a routine 200 that runs continuously that provides a time-ordered list of data samples dependent on continuously acquiring data samples at a data or acquisition driven rate. The median determination routine 202 commences at a start step 201.

In step 201, the list of data samples and the current median are initialized to a state or states where the current median is in accordance with the state of the data sample stored in the list. This is done to create a known current median upon which the following steps are based.

In a next step 203 the routine 202 checks to see whether or not a new incoming data sample is available. If a new incoming data sample is not available, then step 203 iterates until a new incoming data sample is available.

Then, in step 205 the routine 202 determines if a magnitude of a median data sample for the list should increase, remain the same, or decrease by comparing magnitudes of both the incoming data sample and the outgoing data sample to a magnitude of the current median data sample. Referring to FIG. 3 a chart 300 illustrates all nine states to be considered and the three possible outcomes.

FIG. 3 illustrates details of step 205 introduced in FIG. 2 in a tabular format. Chart 300 has two input variables the outgoing data sample 301 and the incoming data sample 303, and an output search space 305 that is determined dependent on the combination of input conditions. For example, when comparing the incoming data sample and the outgoing data sample to the current median data sample an outcome of "no change needed" is realized if both the magnitude of the incoming data sample and the magnitude of the outgoing data sample are greater than the magnitude of the current median data sample. This means that the next median (for the list including the incoming data sample and excluding the outgoing data sample) will have the same magnitude as the current median data sample. All input conditions associated with reference number 307 result in a search space conclusion associated with reference number 313.

In another case, illustrated at reference number 309, when either the magnitudes of the outgoing data sample and incoming data sample are correspondingly greater than and less than, or equal to and less than the magnitude of the current median data sample, the search space is limited to a conclusion that the magnitude of the next median data sample is either equal to the magnitude of the current median data sample or equal to the magnitude of a data sample having a magnitude most adjacent and less than the magnitude of the current median data sample as shown at reference number 315.

In another case, illustrated at reference number 311, when either the magnitudes of the outgoing data sample and incoming data sample are correspondingly less than and greater than, or equal to and greater than the magnitude of the current median, the search space is limited to a conclusion that the magnitude of the next median data sample is either equal to the magnitude of the current median data sample or equal to the magnitude of a data sample having a magnitude most adjacent and greater than the magnitude of the current median data sample as shown at reference number 317. Note that there is no conclusive test here as to whether or not the search space can be limited to "no change needed".

Returning to FIG. 2, essentially, in step 205 the routine 202 determines if the magnitude of the median data sample for the list should increase or remain the same as current median data sample, or should decrease or remain the same as current median data sample, by comparing magnitudes of both the incoming data sample and the outgoing data sample to the magnitude of the current median data sample. The result of the test is to provide a sign indication, or equivalently, reduce the search space for the next median from three possible choices to no more than two.

Next, at step 207 the routine 202 identifies a data sample having a magnitude most adjacent to and greater than the current median data sample if the median data sample for the list should increase as determined in step 205, and identifies a data sample having a magnitude most adjacent to and less than the current median data sample if the median data sample for the list should decrease as determined in step 205, and provides a most adjacent data sample dependent on which of the previously-stated conditions apply.

Then, in step 209 the magnitude of the current median data sample is changed to a magnitude of the most adjacent data sample if the number of data samples from the list having a magnitude less than the current median data sample is greater than (N−1)/2 or the number of data samples from the list having a magnitude less or equal to the current median data sample is less than or equal to (N−1)/2. Otherwise, the median data sample for the list is numerically equivalent to the current median data sample and no change is made. Next, in FIG. 4 a more detailed explanation is given of how the search method of this embodiment can be carried out.

The determination of whether or not the current median data sample should change can also be derived with other equivalent approaches without departing from the essence of the described approach. For instance, in step 209, the criterion required for changing the current median data sample can be modified to state: The magnitude of the current median data sample is changed to a magnitude of the most adjacent data sample if the number of data samples from the list having a magnitude greater than the current median data sample is greater than (N−1)/2) or the number of data samples from the list having a magnitude greater or equal to the current median data sample is less than or equal to (N−1)/2).

Figure 4B:
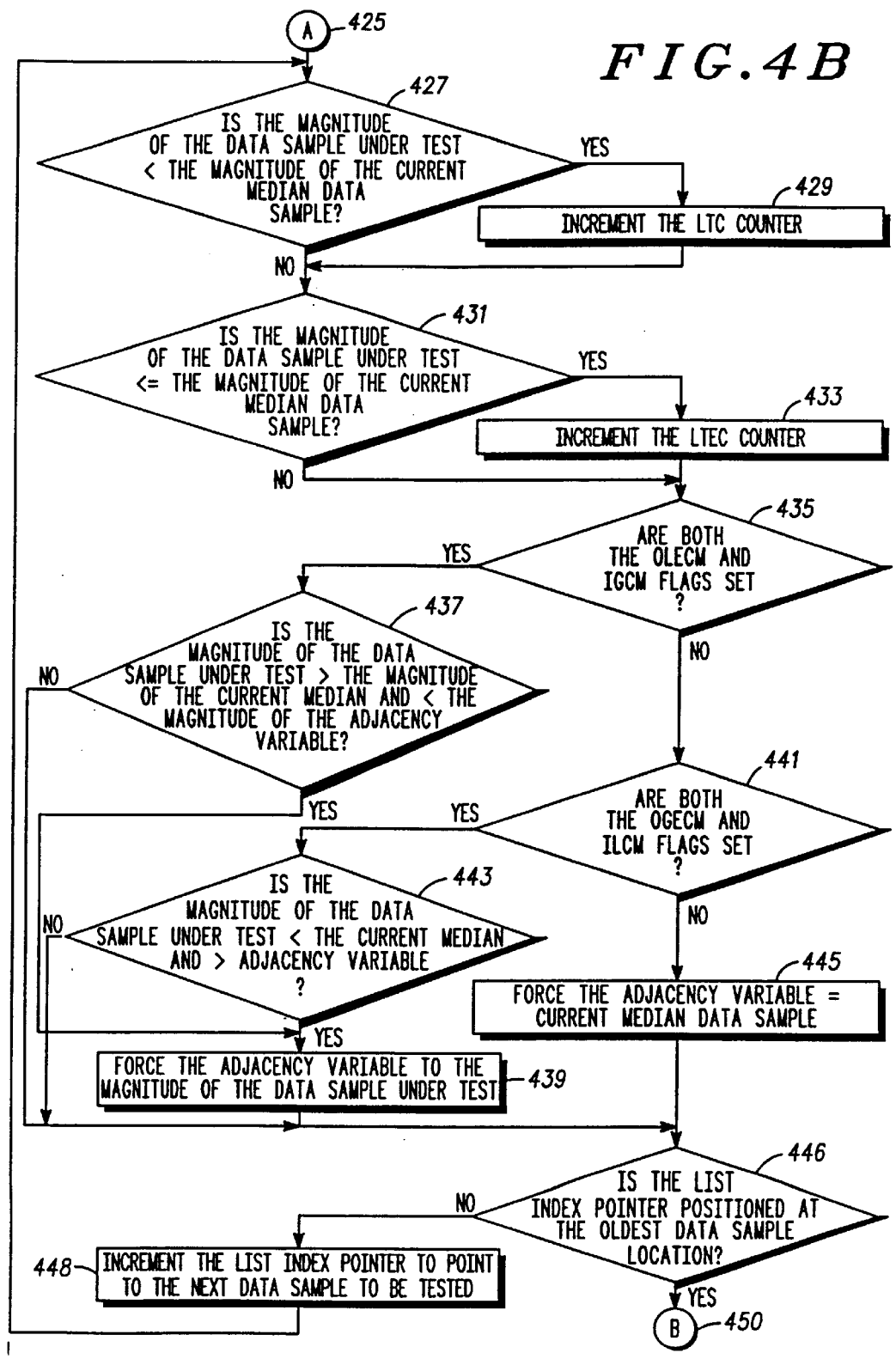
Figure 4C:
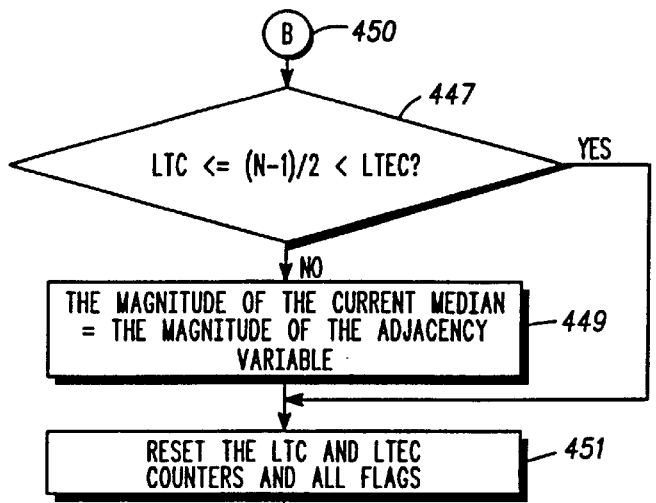

FIG. 4 is separated into three separate charts. FIGS. 4A, 4B, and 4C which articulate a routine 400. In a method embodiment The routine 400 preferably is embedded into a Motorola MC68HC332 microcontroller in the grading mechanism 117 introduced in FIG. 1. Alternatively, the method steps could be implemented in a hardware state machine. The routine 400 commences at a start step 401. Essentially the flow chart labeled FIG. 4A implements the method step 205 of FIG. 2 in greater detail.

In a next step 403, the routine's variables get initialized as follows: an LTC count (less than count) is set to zero; LTEC count (less than or equal count) is set to zero; CM (current median) register is set to zero; and all of the data registers in the circular queue or list are set to zero. It is important to note that the magnitude of the CM register must be arithmetically equal to the current median value of the data samples of the list. If not, then the filter will not converge. Therefore, the preset values of the data registers and the CM register that meet this criteria will work. In the next series of steps, in order to eliminate one traversal of the list, a reduced search space is determined for the median for a new list as follows.

In step 405, a test is made to see if a magnitude of the outgoing data sample is greater than or equal to a magnitude of the current median data sample. If it is, then an OGECM (outgoing greater than or equal to current median) flag is set in step 407. A set state of the OGECM flag indicates that the magnitude of the outgoing data sample is greater than or equal to the magnitude of the current median data sample. If the magnitude of the outgoing data sample is less than the magnitude of the current median data sample then step 409 is executed. After step 407 has been completed, step 409 is executed next.

In step 409, a test is executed to determine whether or not the magnitude of the outgoing data sample is less than or equal to the magnitude of the current median data sample. If it is, then step 411 is executed.

In step 411, an OLECM (outgoing less than or equal to current median) flag is set. A set state of the OLECM flag indicates that the magnitude of the outgoing data sample is less than or equal to the magnitude of the current median data sample. After step 411 has executed, or if the magnitude of the outgoing data sample was greater than the magnitude of the current median data sample, step 413 is executed.

In step 413, the routine 400 fetches the incoming data sample and puts it into the oldest data sample location in the circular list.

Next in step 415, a test is made to see whether or not the magnitude of the incoming data sample is greater than the magnitude of the current median data sample. If the magnitude of the incoming data sample is greater than the magnitude of the current median data sample, then step 417 is executed.

In step 417, an IGCM (incoming greater than current median) flag is set. A set state of the IGCM flag indicates that the magnitude of the incoming data sample is greater than the magnitude of the current median. Following step 417, or also in step 415 if the magnitude of the incoming data sample is less than or equal to the magnitude of the current median data sample, step 419 is executed.

In step 419, a test is made to see whether or not the magnitude of the incoming data sample is less than the magnitude of the current median data sample. If it is, then step 421 is executed.

In step 421, an ILCM (incoming less than current median) flag is set. A set state of the ILCM flag indicates that the magnitude of the incoming data sample is less than the magnitude of the current median data sample.

Following step 421, or also if the magnitude of the incoming data sample was greater than or equal to the magnitude of the current median data sample as determined in step 419, step 423 is executable and an adjacency variable is set equal to the magnitude of the incoming data sample. The adjacency variable may optionally be stored in a register.

Next, connector 425 labeled "A" connects to FIG. 4B connector 425 labeled "A".

Essentially the flow chart labeled FIG. 4B implements the method step 207 of FIG. 2 in greater detail.

In step 427, the routine 400 tests to see whether or not the magnitude of the data sample under evaluation is less than the magnitude of the current median data sample. If it is, then step 429 is executed. In step 429, and LTC (less than) counter is incremented. The LTC counter keeps track of how many of the tested data samples have a magnitude that is less than the magnitude of the current median data sample. Upon the completion of step 429, or in step 427 if it was determined that the magnitude of the data sample under evaluation was not less than the magnitude of the current median data sample, step 431 is then executed.

In step 431, the routine 400 checks to see whether or not the magnitude of the data sample under evaluation is less than or equal to the magnitude of the current median data sample. If it is, then step 433 is executed.

In step 433, an LTEC counter is incremented. The LTEC counter keeps track of how many of the tested data samples have a magnitude less than or equal to the magnitude of the current median data sample. At the completion of step 433, or if the magnitude of the data sample under evaluation is not less than or equal to the magnitude of the current median data sample, step 435 is then executed.

In step 435, the routine 400 checks to see if both the OLECM flag and the IGCM flag are set. If they are, step 437 is executed.

Then in step 437, the routine checks to see whether or not the magnitude of the data sample under evaluation is greater than the magnitude of the current median data sample and less than the adjacency variable. If it is determined by step 437 that the magnitude of the data sample under evaluation is not greater than the magnitude of the current median data sample and/or not less than the adjacency variable, the routine skips to step 446. In step 446 an index pointer for the list is checked to see if all of the data samples on the list have been evaluated. If all of the data samples on the list have been evaluated then the routine traverses to a connector labeled "B" 450. If all of the data samples on the list have not been evaluated then the routine next executes step 448 which increments the list index pointer to point to the next data sample on the list to be tested and returns to step 427. If step 437 determines that the magnitude of the data sample under evaluation is greater than the magnitude of the current median data sample and less than the adjacency variable, then step 439 is executed.

In step 439, adjacency variable is set to take on the value of the magnitude of the data sample under evaluation. After the execution of step 439, step 446 is executed as described above.

If in step 435 both the OLECM and IGECM flags were not set, then step 441 is executed.

In step 441, the routine determines whether or not both the OGECM and ILCM flags are set. If both the OGECM and ILCM flags are set, then step 443 is executed.

In step 443, the routine determines whether or not the magnitude of the data sample under evaluation is less than the magnitude of the current median data sample and greater than the adjacency variable. If it is, then step 439 is executed as described above. If the magnitude of the data sample under evaluation is not less than the magnitude of the current median data sample and/or not greater than the adjacency variable, the routine then executes step 446 as described above.

Returning to step 441, if both the OGECM and the ILCM flags are not set, then step 445 is executed.

In step 445, the adjacency variable is equated to the current median data sample. Then step 446 is executed as described above. Connector B 450 of FIG. 4B is connected to connector B 450 of FIG. 4C.

In the next step 447, a test is made to see if the magnitude of the LTC counter has a value less than or equal to the $(N-1)/2$ and the magnitude of the LTEC counter has a value greater than $(N-1)/2$. If not, step 449 is executed.

In step 449, the current median is equated to the adjacency variable. If the tests in 447 pass, or after step 449 is executed, step 451 is executed.

In step 451, both the LTC counter and LTEC counter are reinitialized to zero. Then connector C 453 of FIG. 4C returns the routine execution to connector C 453 on FIG. 4A. The routine will then pause until a new incoming data sample is available.

Figure 5:
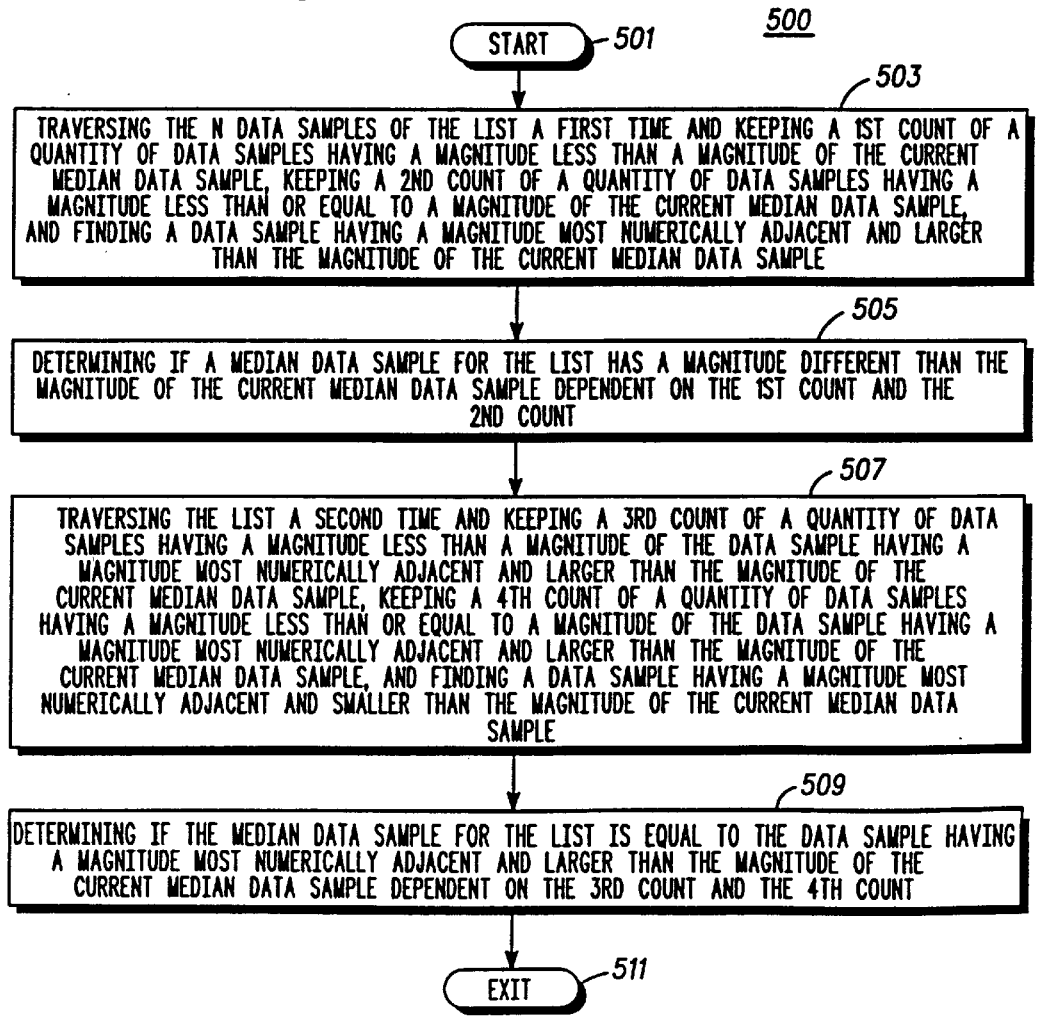
FIG. 5 is a flow chart showing a 2N memory access embodiment in accordance with another embodiment.

Next, FIG. 5 which represents the method steps in the 2N embodiment will be described. A routine 500 commences at a start step 501. Next, in step 503 the N data samples of a list are traversed a first time while keeping a 1st count of a quantity of data samples having a magnitude less than a magnitude of the current median data sample. Concurrently, a 2nd count of a quantity of data samples having a magnitude less than or equal to a magnitude of the current median data sample is kept. Also a data sample having a magnitude most numerically adjacent and larger than the magnitude of the current median data sample is found.

Next, in step 505 it is determined whether or not a median data sample for the list has a magnitude different than the magnitude of the current median data sample dependent on the 1st count and the 2nd count.

Specifically, if the value of the 1st count is less than or equal to $(N-1)/2$ and the value of the 2nd count is greater than $(N-1)/2$, then the median data sample will equal the current median data sample.

If in step 505 it was determined that the median data sample does not equal the current median data sample, then in step 507, the list is traversed a second time and a 3rd count of a quantity of data samples having a magnitude less than a magnitude of the data sample having a magnitude most numerically adjacent and larger than the magnitude of the current median data sample is kept. Concurrently, a 4th count of a quantity of data samples having a magnitude less than or equal to a magnitude of the data sample having a magnitude most numerically adjacent and larger than the magnitude of the current median data sample is kept. Also, a data sample having a magnitude most numerically adjacent and smaller than the magnitude of the current median data sample is found.

In step 509, a determination is made whether or not the median data sample for the list is equal to the data sample having a magnitude most numerically adjacent and larger than the magnitude of the current median data sample dependent on the 3rd count and the 4th count. Specifically, if the value of the 3rd count is less than or equal to $(N-1)/2$ and the value of the 4th count is greater than $(N-1)/2$, then the median data sample will equal the data sample having a magnitude most numerically adjacent and larger than the magnitude of the current median. If the median data sample for the list is not equal to the next larger data sample then it is set to the next smaller data sample. The routine 500 is exited in step 511.

For those systems concerned with the possible occurrence of a random error in memory and its effect on the search method, error correction can be implemented with an additional pass through the list. In this additional pass, the final median result can be directly tested, and if an error is detected, and the derived median is definitely determined not to be the actual median, the memory storage for the list and the current median can be reinitialized.

To implement either of the preferred methods described earlier it would be a simple matter to convert the method operations to digital logic circuitry while maintaining the same structural relationships between elements.

In summary, an improved median search method and filter that is memory access limited so that it can be effectively manufactured on an integrated circuit or efficiently executed as a method has been described. In one embodiment two passes are made on a list of N samples. In another embodiment a pretest is executed on an incoming data sample and an outgoing data sample against a current median data sample to eliminate a pass on the list.

What is claimed is:

1. An iteration efficient median determination method comprising the steps of:

providing a circular list of N data samples including an incoming data sample replacing an outgoing data sample, and a median data sample; and updating the median data sample dependent only on magnitudes of the incoming data sample, the median data sample, and the outgoing data sample.

2. An iteration efficient median determination method comprising the steps of:

providing a circular list of N data samples including an incoming data sample, and a current median data sample;

traversing the N data samples of the list a first time and keeping a 1st count of a quantity of data samples having a magnitude less than a magnitude of the current median data sample, keeping a 2nd count of a quantity of data samples having a magnitude less than or equal to a magnitude of the current median data sample, and finding a data sample having a magnitude most numerically adjacent and larger than the magnitude of the current median data sample;

determining if a median data sample for the list has a magnitude different than the magnitude of the current median data sample dependent on the 1st count and the 2nd count;

traversing the list a second time and keeping a 3rd count of a quantity of data samples having a magnitude less than a magnitude of the data sample having a magnitude most numerically adjacent and larger than the magnitude of the current median data sample, keeping a 4th count of a quantity of data samples having a magnitude less than or equal to a magnitude of the data sample having a magnitude most numerically adjacent and larger than the magnitude of the current median data sample, and finding a data sample having a magnitude most numerically adjacent and smaller than the magnitude of the current median data sample; and determining if the median data sample for the list is equal to the data sample having a magnitude most numerically adjacent and larger than the magnitude of the current median data sample dependent on the 3rd count and the 4th count.

3. A method in accordance with claim 2 further comprising the step of:

initializing the circular list to a predetermined state and initializing the current median data sample to a magnitude equivalent to a median of the initialized circular list.

4. A method in accordance with claim 2 further comprising the step of:

subtracting a magnitude of the current median data sample from a magnitude of a data sample occupying a time centered position within the circular list and providing a filtered median data sample dependent thereon.

5. An iteration efficient median determination method comprising the steps of:

providing a circular list of N data samples including an incoming data sample, a current median data sample, and an outgoing data sample;

determining if a magnitude of a median data sample for the list should increase or remain the same as the current median data sample and determining if the median data sample for the list should decrease or remain the same as current median data sample, by comparing magnitudes of both the incoming data sample and the outgoing data sample to a magnitude of a current median data sample and providing a sign indication dependent thereon;

searching the circular list and identifying a data sample of the N data samples having a magnitude most adjacent to and greater than the current median data sample if the median data sample for the list should increase as determined by the sign indication and identifying a data sample having a magnitude most adjacent to and less than the current median data sample if the median data sample for the list should decrease as determined by the sign indication and providing a most adjacent data sample dependent thereon; and changing a magnitude of the current median data sample to the most adjacent data sample identified in the step of searching if a number of data samples from the circular list having a magnitude less than the current median is greater than (N−1)/2 or if a number of data samples from the circular list having a magnitude less than or equal to the current median data sample is less than or equal to (N−1)/2.

6. A method in accordance with claim 5 further comprising the step of:

initializing the circular list to a predetermined state and initializing the current median data sample to a magnitude equivalent to a median of the initialized circular list.

7. A method in accordance with claim 5 further comprising the step of:

replacing the outgoing data sample on the circular list with incoming data sample before execution of the step of determining.

8. A method in accordance with claim 5 wherein the outgoing data sample is provided at a time before the provision of the incoming data sample.

9. A method in accordance with claim 5 further comprising the step of: subtracting a magnitude of the current median data sample from a magnitude of a data sample occupying a time centered position within the circular list and providing a filtered median data sample dependent thereon.

10. An iteration efficient median filter comprising:

a circular list for holding N data samples, the data samples comprising
an incoming data sample, an outgoing data sample, and a median data sample; and
a grading mechanism for selecting a new median data sample dependent only on magnitudes of the incoming data sample, the median data sample, and the outgoing data sample.

11. A filter in accordance with claim 10 further comprising:

means for initializing the circular list to a predetermined state and initializing the median data sample to a magnitude equivalent to a median of the initialized circular list.

12. A filter in accordance with claim 10 further comprising:

means for subtracting a magnitude of the median data sample from a magnitude of a data sample occupying a time centered position within the circular list and providing a filtered median data sample dependent thereon.

* * * * *